United States Patent
Wang et al.

(10) Patent No.: US 8,957,505 B2
(45) Date of Patent: Feb. 17, 2015

(54) DEVICE SUBSTRATE AND FABRICATION METHOD THEREOF

(71) Applicant: Au Optronics Corporation, Hsinchu (TW)

(72) Inventors: Cheng-Liang Wang, Hsinchu County (TW); Shih-Hsing Hung, Hsinchu County (TW); Keh-Long Hwu, Hsinchu County (TW)

(73) Assignee: Au Optronics Corporation, Hsinchu (TW)

( * ) Notice: Subject to any disclaimer, the term of this patent is extended or adjusted under 35 U.S.C. 154(b) by 0 days.

(21) Appl. No.: 13/781,778

(22) Filed: Mar. 1, 2013

(65) Prior Publication Data
US 2014/0077340 A1    Mar. 20, 2014

(30) Foreign Application Priority Data
Sep. 19, 2012  (TW) ............................ 101134308 A (51) Int. Cl.
*H01L 29/06* (2006.01)
*H01L 23/00* (2006.01)
*H01L 21/02* (2006.01)
*H01L 21/48* (2006.01)

(52) U.S. Cl.
CPC ........ *H01L 23/562* (2013.01); *H01L 21/02107* (2013.01); *H01L 21/48* (2013.01)
USPC .............................................. 257/622; 257/623

(58) Field of Classification Search
USPC .................................................. 257/622, 623
See application file for complete search history.

(56) References Cited

U.S. PATENT DOCUMENTS

| | | | |
|---|---|---|---|
| 6,720,586 B1 * | 4/2004 | Kidoguchi et al. | 257/103 |
| 2005/0270473 A1 | 12/2005 | Shiao et al. | |
| 2009/0267083 A1 * | 10/2009 | Cui | 257/79 |
| 2012/0052214 A1 | 3/2012 | Tsai et al. | |
| 2012/0267638 A1 * | 10/2012 | Lee et al. | 257/76 |
| 2013/0020726 A1 * | 1/2013 | Kim et al. | 257/787 |
| 2014/0001604 A1 * | 1/2014 | Sadaka | 257/621 |

FOREIGN PATENT DOCUMENTS

| | | |
|---|---|---|
| CN | 102185023 | 9/2011 |
| TW | I336222 | 1/2011 |
| TW | 201212749 | 3/2012 |

* cited by examiner

*Primary Examiner* — Phat X Cao
(74) *Attorney, Agent, or Firm* — Jianq Chyun IP Office (57) ABSTRACT

A fabricating method of a device substrate including the following procedures is provided. First, a substrate is provided and a patterned structure is formed on the substrate, wherein the patterned structure includes a plurality of openings. Then, a protective layer is formed on the patterned structure, wherein the protective layer does not fully fill the openings of the patterned structure such that a gap is existed between the protective layer and the patterned structure. Later, a device layer is formed on the protective layer.

7 Claims, 6 Drawing Sheets

DEVICE SUBSTRATE AND FABRICATION METHOD THEREOF

CROSS-REFERENCE TO RELATED APPLICATION

This application claims the priority benefit of Taiwan application serial no. 101134308, filed on Sep. 19, 2012. The entirety of the above-mentioned patent application is hereby incorporated by reference herein and made a part of this specification.

TECHNICAL FIELD

The invention relates to a substrate and a fabricating method thereof, and also relates to a device substrate and a fabricating method thereof.

BACKGROUND

In order to possess a flexible characteristic, the current flexible displays use a flexible substrate, such as a plastic substrate or a polymer substrate, to replace a glass substrate. Since the chemical-resistant property of a flexible substrate is poor, a flexible substrate is easily damaged during an etching process. A dielectric protective layer is typically added to obviate damages to the device. The dielectric protective layer may be a silicon oxide, aluminum oxide or silicon nitride type of inorganic material dielectric layer.

Asides from protecting the flexible substrate, the inorganic material dielectric layer may also have the function of blocking moisture and oxygen. For example, when the subsequently applied device is a photovoltaic cell or an organic light-emitting diode (OLED), this type of devices requires better moisture-blocking and air-blocking effect. Currently, such an effect is achieved via the stacking of multiple layers of the dielectric protective layer.

If the flexible substrate is formed by a thin film fabrication process with a sheet-to-sheet method, the phenomenon of residual stress often occurs. Typically, the residual stress that is generated on the dielectric protective layer of the flexible substrate is divided into two parts: intrinsic stress and thermal stress, wherein the intrinsic stress is further divided into compressive stress and tensile stress. Irrespective to the stress being a compressive stress or a tensile stress, the flexible substrate may become warped when the flexible substrate is removed from a glass carrier. Hence, the risk of broken lead/line and misalignment in the photolithography process is increased.

SUMMARY

An exemplary embodiment of the disclosure provides a device substrate in which the effect of stress may be mitigated and desirable moisture-blocking and oxygen-blocking characteristics may be provided.

An exemplary embodiment of the disclosure provides a fabrication method of a device substrate, in which a device substrate with desirable moisture-blocking and oxygen-blocking characteristics may be fabricated.

An exemplary embodiment of the disclosure provides a fabrication method of a device substrate, and the method includes the following procedures. Firstly, a substrate is provided and a patterned structure is formed on the substrate, wherein the patterned structure includes a plurality of openings. Then, a protective layer is formed on the patterned structure, wherein the protective layer does not completely fill the openings of the patterned structure. As such, air gaps are present between the protective layer and the patterned structure. Thereafter, a device layer is formed on the protective layer.

An exemplary embodiment of the disclosure provides a device substrate, which includes a substrate, a patterned structure, a protective layer and a plurality of openings. The protective layer is configured on the patterned structure, wherein the protective layer does not fully filled the openings of the patterned structure. As such, air gaps are formed between the protective layer and the patterned structure. The device layer is configured on the protective structure.

According to the exemplary embodiments of the disclosure, gaps are present between the protective layer of the device substrate and the patterned structure. These gaps help to mitigate the stress on the device substrate. Moreover, these gaps assist in enhancing the bending characteristic of the device substrate and provide the substrate with desirable moisture-blocking and oxygen-blocking properties.

The invention and certain merits provided by the invention can be better understood by way of the following exemplary embodiments and the accompanying drawings, which are not to be construed as limiting the scope of the invention.

DETAILED DESCRIPTION OF DISCLOSED EMBODIMENTS

Figure 1A:
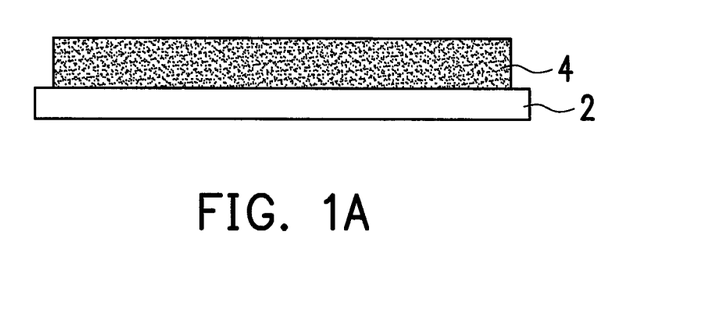
FIGS. 1A to 1E are schematic diagrams of a fabricating method of a device substrate according to an exemplary embodiment of the disclosure.

FIGS. 1A to 1E are schematic diagrams of a fabricating method of a device substrate according to an exemplary embodiment of the disclosure. Referring to FIG. 1A, a substrate 4 is formed on a glass substrate 2, wherein the glass substrate 2 may be replaced by other types of hard substrate. In this exemplary embodiment, the substrate 4 is a plastic substrate, for example, and is formed by a coating method, such as slot die coating, spin coating, spray coating, thermal evaporation, for example. Moreover, in other exemplary embodiments, the substrate 4 may be a polymer substrate or other appropriate flexible substrates.

Figure 1B:
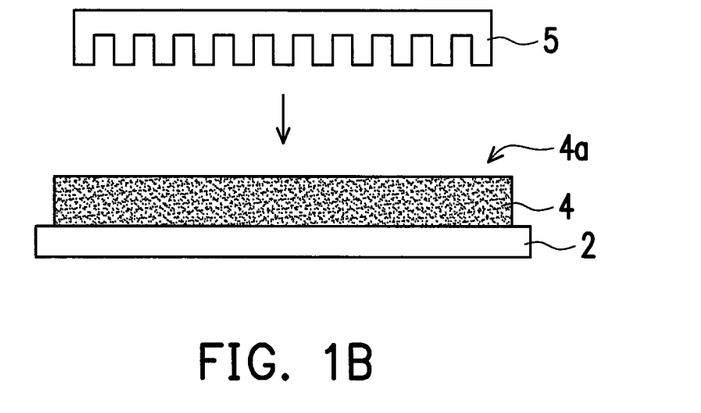
Figure 1C:
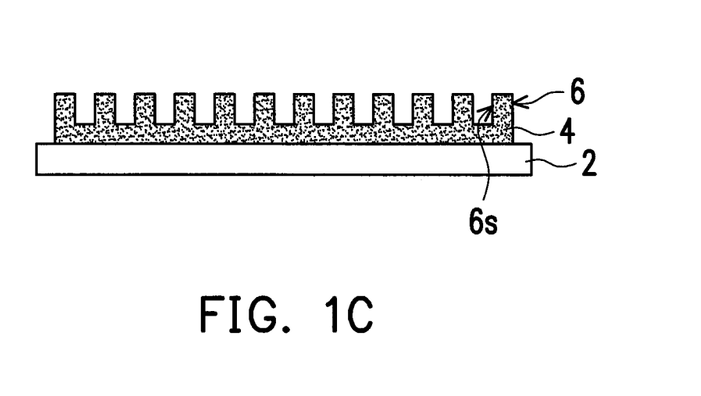

Thereafter, referring to FIGS. 1B and 1C, a patterning procedure is performed on the substrate 4 to form a patterned structure 6 on the substrate 4. As shown in FIG. 1B, the above-mentioned patterning procedure includes, for example, an imprinting method, in which a pressure is applied to the substrate via a mold 5 to provide the surface 4a of the substrate 4 with a patterned structure 6. The patterned structure 6 includes a plurality of openings 6s. It should be noted that the above press imprinting method used in this exemplary embodiment should not be construed as a limitation to the scope of the disclosure in any manner. In other exemplary embodiments, other suitable patterning procedures for forming the plurality of openings 6s may also be used.

Figure 2A:
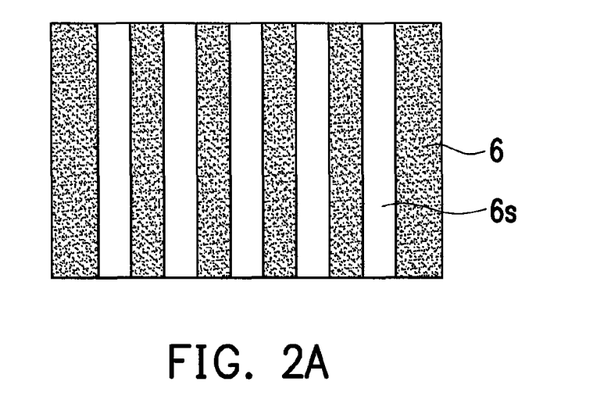
FIGS. 2A to 2C are schematic diagrams of shapes of the openings according to an exemplary embodiment of the disclosure.
Figure 2B:
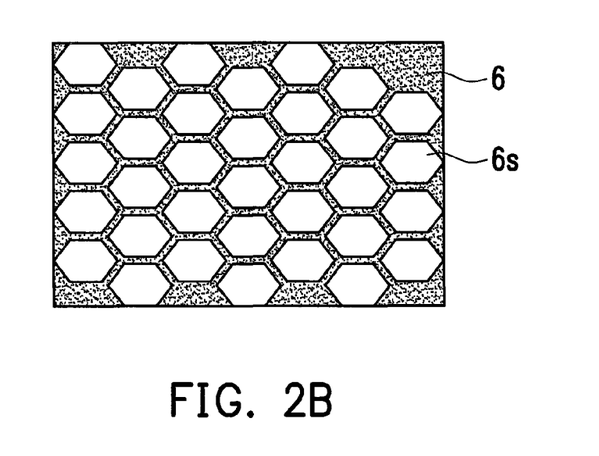
Figure 2C:
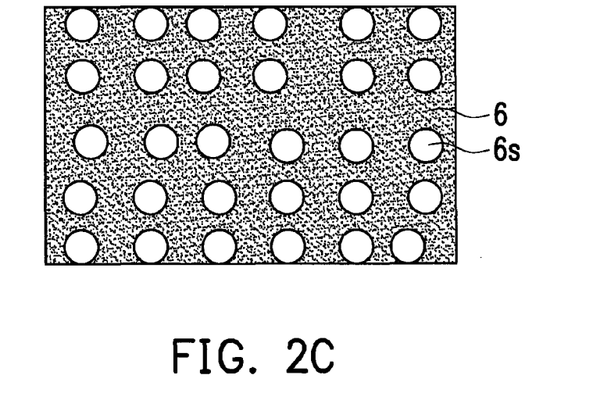

In this exemplary embodiment, the aspect ratio of these openings 6s is greater than 1. Alternatively speaking, the depth of these openings 6s is greater than the width of these openings 6s. Furthermore, the shape of these openings 6s is not limited and the openings 6s could have any shape. For example, the openings 6s of the patterned structure 6 may be trench-type openings as shown in FIG. 2A. The openings 6s of the patterned structure 6 may also include honeycomb-shaped openings, as shown in FIG. 2B. The openings 6s of the patterned structure 6 may also include pore-like openings, as shown in FIG. 2c.

Figure 1D:
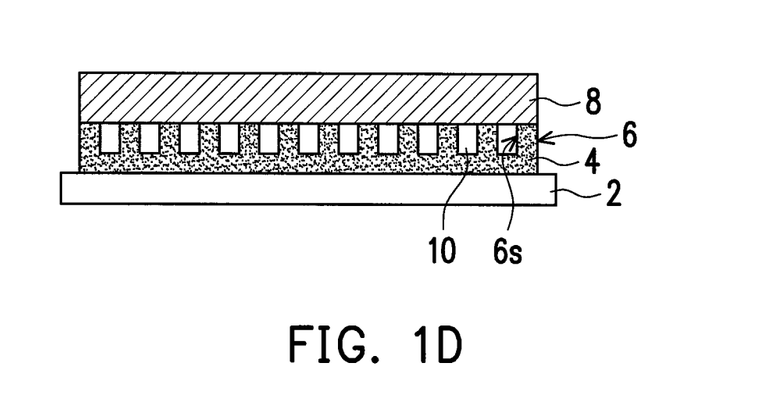

Further, as shown in FIG. 1D, a protective layer 8 is formed on the patterned structure 6, wherein the protective layer 8 does not fill the openings 6s of the patterned structure completely. As such, air gaps 10 are present between the protective layer 8 and the patterned structure 6. More specifically, the protective layer 8 is formed by, for example, plasma enhanced chemical vapor deposition (PECVD), wherein by properly setting the parameters of the plasma enhanced chemical vapor deposition procedure, the openings 6s of the patterned structure 6 not being completely filled by the protective layer 8 can be achieved.

For example, the gas flow of the PECVD procedure may be between 200 sccm to 1000 sccm, and the radio frequency power is, for example, 2000 watts to 4000 watts. The deposition temperature is between, for example, 170° C. to 400° C. The thickness of the protective layer 8 is greater than or equal to ⅔ of the width of the openings. The thickness of the protective layer 8 is about 10 nm to 2 micron.

In this exemplary embodiment, the protective layer 8 is formed with an inorganic material, such as silicon nitride. The process gases that are being used include ammonia ($NH_3$) and silane ($SiH_4$), and the gas flow ratio of ammonia and silane is greater than or equal to 1. Further, the gas flow of ammonia or silane is about 200 sccm to 1000 sccm.

Through the application of the above-said process parameters and the appropriate aspect ratio of the openings 6s, the protective layer 8 does not fill the openings completely during the deposition process and the protective layer extends in two dimension to form a continuous thin film. Since the openings 6s are not completely filled, air gaps 10 are present between the protective layer 8 and the patterned structure 6. It should be noted that the material of the protective layer 8 being silicon nitride in the foregoing description and examples are intended for illustration, not for limitation the scope of the disclosure. The material of the protective layer 8 may include other nitride materials, oxide materials or appropriate inorganic materials.

Figure 1E:
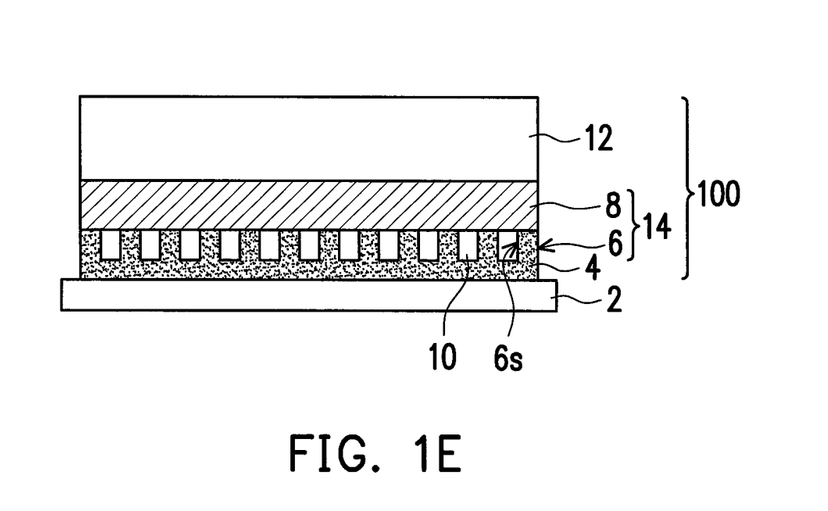

Thereafter, a device layer 12 is formed on the protective layer 8 to fabricate a device substrate 100, wherein the device layer 12 is formed by a deposition procedure. Since the device substrate 100 of the exemplary embodiment includes air gaps 10, during the deposition of the device layer 12 thin film on the protective layer 8, the generation of stress resulted from the growing of the device 12 thin film is mitigated by these air gaps 10. As such, the formation of surface cracks due to the residual stress of the device layer 12 thin film is reduced.

The device substrate 100 (not shown) is then removed from the glass substrate 2 to complete the fabrication of a device substrate 100. In this exemplary embodiment, the device layer 12 is a thin film transistor layer, an organic light emitting diode layer, a photovoltaic cell layer or an active array organic light emitting diode layer, for example. Through the formation of the different types of device layer 12, the device substrate 100 forms a corresponding flexible electronic device. It should be noted that the disclosure is not limited as such. In other exemplary embodiments, the device layer 12 may be an electronic device layer of other flexible electronic device.

As far as the structure is concerned, referring again FIG. 1E, the device substrate 100 includes the substrate 2, the patterned structure 6, the protective layer 8 and the device layer 12. The patterned structure 6 is configured on the substrate 4 and includes a plurality of openings 6s. The protective layer 8 is configured on the patterned structure 6 and does not completely fill these openings 6s. Accordingly the protective layer 8 and the patterned structure 6 include a plurality of air gaps 10 there-between. Moreover, the device layer 12 is disposed on the protective layer 8.

More specifically, since the device substrate 100 of the exemplary embodiment of the disclosure includes air gaps 10, which may increase the flexibility of the device substrate 100, the bending characteristic of the device substrate 100 is enhanced. Accordingly, the structure of the device substrate 100 of the exemplary embodiments of the disclosure is suitable for the fabrication of each type of flexible electronic device.

Moreover, the device substrate 100 of the exemplary embodiments of the disclosure is provided with air gaps 10. When external moisture and air penetrate from the device substrate 4 toward the direction of the device layer 12, the above air gaps 10 may trap the moisture and the air to alter the transmission path of the moisture and the air in order to reduce the influence of the moisture and the air on the device layer 12. Hence, the probability of the device being damaged is reduced. Accordingly, the moisture-blocking and the oxygen-blocking characteristics of the device substrate 100 are further enhanced.

Figure 3:
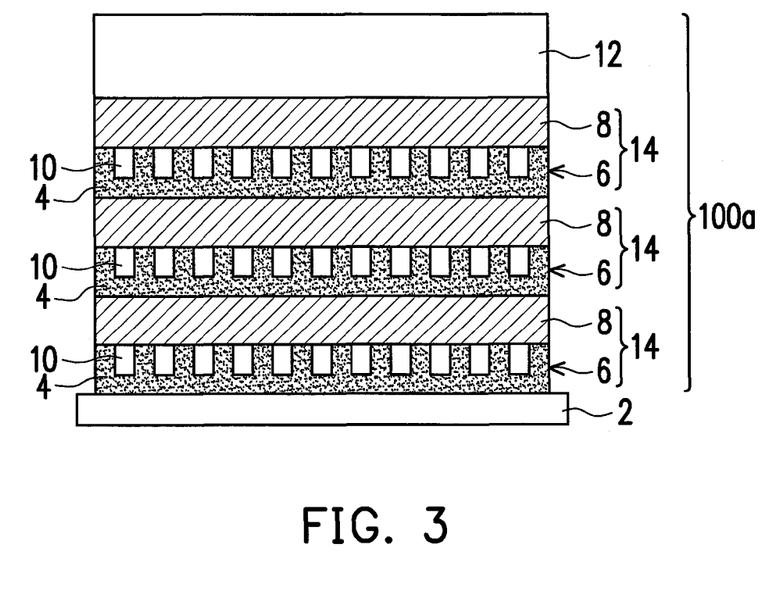
FIG. 3 is a schematic diagram of the structure of a device substrate according to an exemplary embodiment of the disclosure.

From another point of view, the patterned substrate 6 and the protective layer 8 may be viewed as a stacked layer structure 14. Hence, prior to the formation of the device layer 12 of this exemplary embodiment, a stacked layer fabrication procedure is performed to form the stacked layer structure 14. It should be noted that the fabrication procedure of the stacked layer structure in the foregoing description and examples is intended for illustration, not for limitation the scope of the disclosure. In other exemplary embodiments, a plurality of stacked layer fabrication procedures may be performed to form a plurality of stacked layer structures 14, as shown in FIG. 3, prior to the formation of the device layer 12. In FIG. 3, the device substrate 100a includes a plurality of stacked layer structures 14, for example, and a plurality of air gaps 10 is present between the stacked layer structures 14. Hence, the moisture-blocking and the oxygen-blocking characteristics of the device substrate can be further enhanced.

It is worth noting that in the device substrate 100 and the device substrate 100a as illustrated in FIGS. 1E and 3, the patterned structure 6 is formed by performing a patterning process on the substrate 4. The materials of the patterned structure 6 and the substrate 4 are substantially the same. However, the materials of the patterned structure 6 and the substrate 4 in the foregoing description and examples are intended for illustration, not for limitation the scope of the disclosure. In other exemplary embodiments, the materials of the patterned structure 6 and the substrate 4 may be different.

The following exemplary embodiments are used for illustration. In the following exemplary embodiments, a portion of and the same reference numbers of the previous exemplary embodiments are used, wherein the same reference numbers are used in the previous exemplary embodiments and the following exemplary embodiments to refer to the same or like parts. Similar technical details, which may be referred to the disclosure of the previous exemplary embodiments, are omitted here-after.

FIGS. 4A to 4D are schematic diagrams of exemplary fabrication processes that may be used in the fabrication of a device substrate according to an embodiment of the disclosure. The fabrication process of the device substrate 100b of this exemplary embodiment and that of the device substrate 100 of the previous exemplary embodiment are similar. The following disclosure focuses on the differences between the two fabrication processes.

Figure 4A:
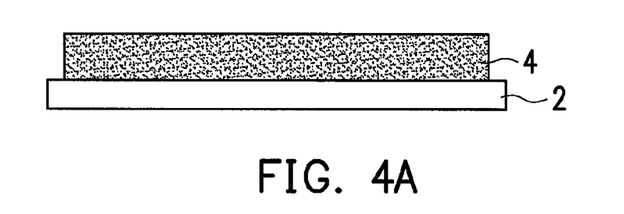
FIGS. 4A to 4D are schematic diagram of exemplary process procedures that may be used in the fabrication of a device substrate according to an embodiment of the disclosure.
Figure 4B:
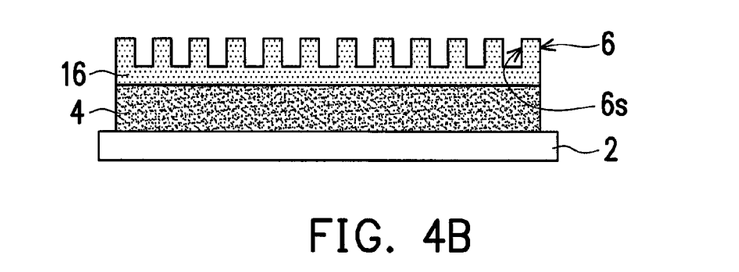

Referring to FIG. 4A, a substrate 4 is formed on the glass substrate 2. Then, referring to FIG. 4B, a material layer 16 is formed on the substrate 4 and a patterning process is performed on the material layer 16 to provide the material layer 16 with a patterned structure 6. In this exemplary embodiment, the materials of the patterned structure 6 and the substrate 4 are different. More specifically, the material layer 16 is an organic material, for example, a photoresist material layer. The patterning process is a photolithography process. A plurality of openings 6s is formed on the surface of the photoresist material layer via the photolithography process to complete the fabrication of a patterned structure 6. The aspect ratio of the openings 6s is greater than 1 and the openings 6s can be in any shape. Further, the type of patterning process is not limited. As long as a patterning structure 6 can be formed on the material layer 16, the patterning procedure is within the spirit and scope of the disclosure.

Figure 4C:
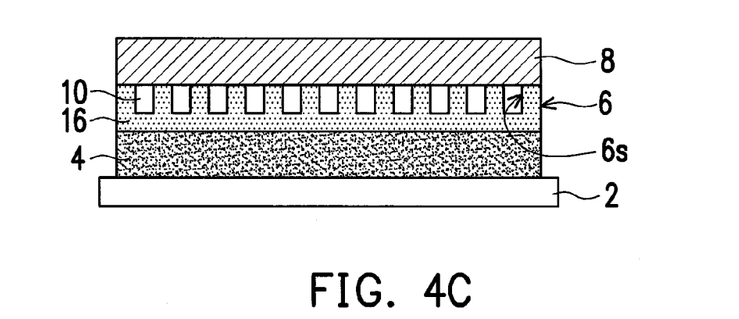

Then, referring to FIG. 4C, a protective layer 8 is formed on the patterned structure 6, which is similar to that of the previous exemplary embodiments, and the protective layer 8 does not fully fill the openings 6s of the patterned structure 6. As such, air gaps 10 are formed between the protective layer 8 and the patterned structure 6. The details of the fabrication procedure as depicted in FIG. 4C can be referred to the fabrication procedure as depicted in FIG. 1D, and will not be further reiterated.

Referring again to FIG. 4D, the structure of the device substrate 100b of this exemplary embodiment is similar to the structure of the device substrate 100 of the previous embodiments; the difference between the two structures lies in that the patterned structure 6 of the device substrate 100 is configured in the substrate 4, while the patterned structure of the device substrate 100b is positioned in the material layer 16.

Figure 4D:
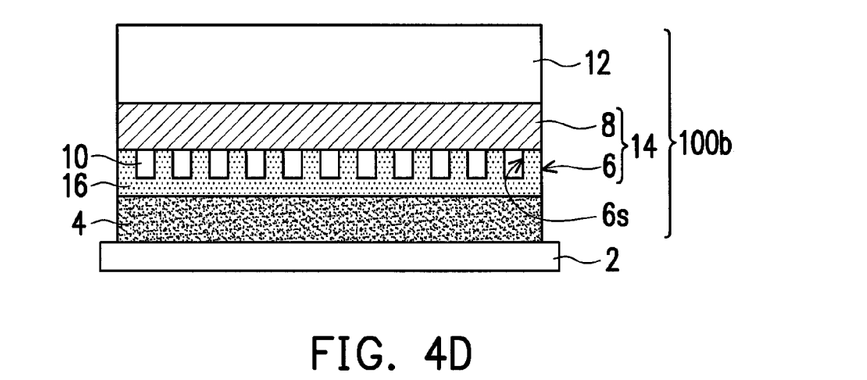

In this exemplary embodiment, the material of the patterned structure 6 is an organic material, for example, while the material of the protective layer 8 is an inorganic material, for example. However, it should be noted that the materials of the patterned structure 6 and the protective layer 8 used in this exemplary embodiment should not be construed as a limitation to the scope of the disclosure in any manner. In other exemplary embodiments, the material of the patterned structure 6 may be an inorganic material, while the material of the protective layer 8 is an organic material, for example.

The organic material of the disclosure is selected from organic materials having a coefficient of thermal expansion (CTE) between 3 ppm/° C. to 40 ppm/° C. When a coefficient of thermal expansion of a material is too high, residual stress is generated, which then leads to excessive substrate stress and deformation of the substrate. Further, the thickness of the protective layer 8 needs to be greater than the depth of the openings 6s in the patterned structure 6 to achieve a planarized surface.

From another point of view, the device substrate 100b is formed by forming a stacked layer structure 14 by performing one stacked-layer structure fabrication procedure, wherein the stacked layer structure 14 is constituted with the patterned structure 6 and the protective layer 8. It should be noted that the disclosure is not limited as such. In other exemplary embodiments, prior to forming the device layer 12, multiple stacked-layer structure fabrication procedures may be performed to form a plurality of stacked layer structures 12, as shown in FIG. 5.

Figure 5:
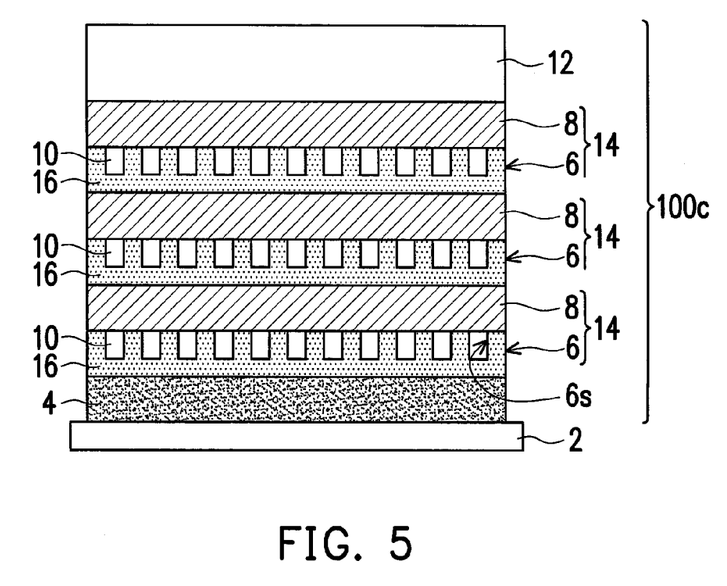
FIG. 5 is a schematic diagram of the structure of a device substrate according to an exemplary embodiment of the disclosure.
Figure 6:
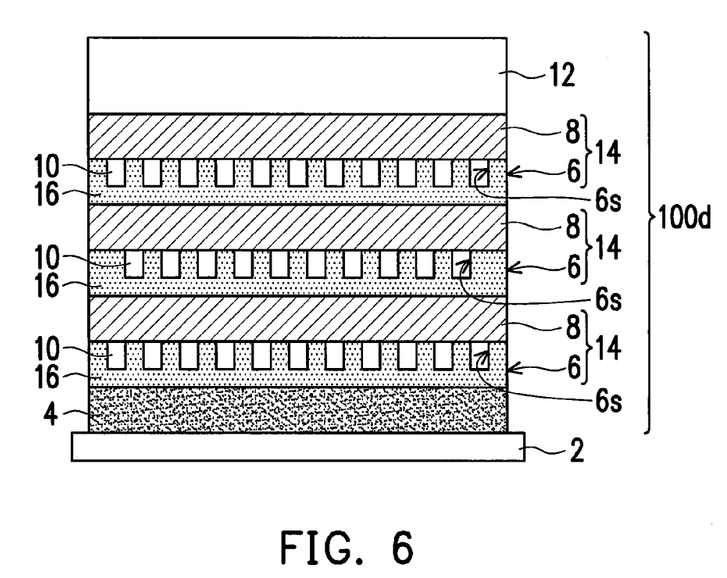
FIG. 6 is a schematic diagram of the structure of a device substrate according to another exemplary embodiment of the disclosure.

Moreover, in the exemplary embodiment as shown in FIG. 5, the openings 6s of the patterned structure 6 in each stacked layer structure 14 are correspondingly disposed, for example. However, the above configuration of the openings 6s should not be construed as a limitation to the scope of the disclosure in any manner. In the device substrate 100d of other exemplary embodiments, the openings 6s positioned at different stacked layer structures 14 are not aligned, as shown in FIG. 6.

Accordingly, the device substrate 100c as shown in FIG. 5 includes, for example, a plurality of stacked layer structures 14, wherein a plurality of gaps 10 is present between the stacked layer structures 14. Hence, the moisture-blocking and the oxygen-blocking characteristics of the device substrate 100c can be further enhanced.

According to the above exemplary embodiments of the disclosure, a plurality of gaps is present between the protective layer and the patterned structure of the device substrate. These gaps help in alleviating the stress generated during the formation of the device layer on the protective layer; hence, the occurrence of surface cracks on the thin film of the device layer is reduced. Moreover, these gaps aid in increasing the bending characteristic of the device substrate itself. Therefore, the device substrate is applicable as a device substrate of a flexible electronic device. Moreover, these gaps also contribute to the alteration and the extension of the transmission pathways of moisture and oxygen prior to their entry into the device layer. Accordingly, the device substrate is provided with favorable moisture-blocking and oxygen-blocking characteristics.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A device substrate, comprising:
   a flexible substrate;
   a patterned structure configured on the flexible substrate, and the patterned structure comprising a plurality of openings, wherein an aspect ratio of the plurality of openings of the patterned structure is greater than 1;
   a protective layer, configured on the patterned structure, wherein the protective layer does not completely fill the plurality of openings of the patterned structure to provide air gaps between the protective layer and the patterned structure, and the patterned structure comprises an organic material and the protective layer comprises an inorganic material; and
   a device layer, configured on the protective layer.

2. The device substrate of claim 1, wherein the patterned structure and the substrate are constituted with a same material.

3. The device substrate of claim 1, wherein a coefficient of thermal expansion of the organic material is between about 3 ppm/° C. to 40 ppm/° C.

4. The device substrate of claim 1, wherein the patterned structure and the protective layer constitute a stacked layer structure, and a plurality of stacked layer structures are disposed between the substrate and the device layer.

5. The device substrate of claim 1, wherein the device layer comprises a thin film transistor layer, an organic light emitting diode layer, a photovoltaic solar cell layer or an active array organic light emitting diode layer.

6. The device substrate of claim 1, wherein the plurality of openings of the patterned structure comprise trench type openings, honeycomb-shape openings and pore-like openings.

7. The device substrate of claim 1, wherein the flexible substrate has no contact with the plurality of openings of the patterned structure.

* * * * *